United States Patent [19]

Uenishi et al.

[11] Patent Number: 5,576,139
[45] Date of Patent: Nov. 19, 1996

[54] POSITIVE TYPE PHOTORESIST COMPOSITION COMPRISING A NOVOLAK RESIN MADE WITH A SILICA-MAGNESIA SOLID CATALYST

[75] Inventors: Kazuya Uenishi; Shiro Tan; Yasumasa Kawabe; Tadayoshi Kokubo, all of Shizuoka, Japan

[73] Assignee: Fuji Photo Film Co., Ltd., Kanagawa, Japan

[21] Appl. No.: 783,346

[22] Filed: Oct. 28, 1991

[30] Foreign Application Priority Data

Nov. 9, 1990 [JP] Japan ................................ 2-304268

[51] Int. Cl.$^6$ .................................................... G03F 7/023
[52] U.S. Cl. ...................... 430/192; 430/191; 430/193; 528/140
[58] Field of Search ................................... 430/192, 193, 430/165, 191, 166; 528/140

[56] References Cited

U.S. PATENT DOCUMENTS

| | | | |
|---|---|---|---|
| 4,894,311 | 1/1990 | Uenishi et al. | 430/192 |
| 4,957,846 | 9/1990 | Jeffries, III et al. | 430/192 |
| 4,970,287 | 11/1990 | Blakeney et al. | 430/192 |
| 4,988,601 | 1/1991 | Ushirogouchi et al. | 430/192 |
| 5,110,706 | 5/1992 | Yumoto et al. | 430/191 |
| 5,232,819 | 8/1993 | Jeffries, III et al. | 430/192 |

*Primary Examiner*—John S. Y. Chu
*Attorney, Agent, or Firm*—Sughrue, Mion, Zinn, Macpeak & Seas

[57] ABSTRACT

A novel positive type photoresist composition is provided, comprising an alkali-soluble novolak resin obtained by the condensation of substituted or unsubstituted phenols and aldehydes in the presence of a silica-magnesia solid catalyst and a light-sensitive material containing 1,2-naphthoquinone-diazido-5-(and/or -4-) sulfonate as main component.

7 Claims, No Drawings

POSITIVE TYPE PHOTORESIST COMPOSITION COMPRISING A NOVOLAK RESIN MADE WITH A SILICA-MAGNESIA SOLID CATALYST

FIELD OF THE INVENTION

The present invention relates to a positive type photoresist composition which consists of a specific alkali-soluble novolak resin and a 1,2-quinonediazide compound and is sensitive to radiation such as ultraviolet rays, far ultraviolet rays, X-rays, electron rays, molecular beam, γ-rays and synchrotron radiation. More particularly, the present invention relates to a photoresist composition for fine work which provides excellent resolution, sensitivity, heat resistance and developability.

A positive type photoresist of the present invention is coated on a substrate such as semiconducting wafer, glass, ceramics and metal by a spin coating method or roller coating method to a thickness of 0.5 µm to 3 µm. The coat material is then heated and dried. A circuit pattern or the like is printed on the material through an exposure mask by the irradiation with ultraviolet rays. The material is then subjected to development to obtain a positive image. Subsequently, the positive image is used as a mask to effect patterned etching on a substrate. Typical applications of positive type photoresist are production of semiconductors such as IC, production of circuit board such as liquid crystal and thermal head, and photofabrication.

BACKGROUND OF THE INVENTION

As positive type photoresist compositions there are normally used compositions comprising an alkali-soluble resin and a naphthoquinone diazide compound as light-sensitive material. Examples of such compositions include novolak type phenol resin/naphthoquinone diazide-substituted compounds disclosed in U.S. Pat. Nos. 3,666,473, 4,115,128, and 4,173,470. Most typical examples of such compositions include novolak resin made of cresol-formaldehyde/trihydroxybenzophenone-1,2-naphthoquinonediazidesulfonic ester disclosed in L. F. Thompson, "Introduction to Microlithography", ACS, No. 219, pp. 112–121.

A binder, novolak resin can be dissolved in an alkaline aqueous solution without swelling. The novolak resin can also exhibit a high resistance particularly to plasma etching when an image thus produced is used as a mask for etching. Thus, novolak resin is particularly useful in this application. A light-sensitive material, naphthoquinone diazide compound itself serves as a dissolution inhibitor for reducing the alkali solubility of novolak resin but is peculiar in that it undergoes decomposition upon the irradiation with light to produce an alkali-soluble substance which rather enhances the alkali solubility of novolak resin. Because of the great change in properties by the irradiation with light, naphthoquinone diazide compound is particularly useful as light-sensitive material for positive type photoresist.

From such a standpoint of view, many positive type photoresists comprising novolak resin and naphthoquinone diazide light-sensitive material have heretofore been developed and put into practical use. These positive type photoresists have attained sufficient results in working lines of a width of 1.5 µm to 2 µm.

However, integrated circuits have added to their degree of integration. It is a recent tendency that the working of ultrafine patterns formed of lines of a width of 1 µm or less is required in the production of semiconductor substrates such as SLSI. In such an application, a photoresist having a high resolution, a high accuracy of reproduction of exposure mask pattern and a high sensitivity for high productivity has been desired.

In such an application, techniques concerning monomer compositions and synthesis methods have been disclosed. For example, JP-A-62-35349 (the term "JP-A" as used herein means an "unexamined published Japanese patent application") discloses the use of a novolak resin obtained by the addition condensation of a cresol mixture consisting of 10 to 45% by weight of m-cresol and 55 to 90% by weight of p-cresol with formaldehyde in the presence of an acid catalyst. However, this method is disadvantageous in that when it is attempted to obtain a high resolution and an excellent profile, the resulting sensitivity is low.

Further, JP-A-60-159846 discloses the use of a novolak resin obtained by the addition condensation of phenols with formaldehyde at a pH value of 4 to 7 in the presence of an organic acid salt of a divalent metal electronegatively lower than hydrogen as catalyst. This process, too, is disadvantageous in that although it provides an excellent sensitivity and resolution, it gives a poor heat resistance.

Thus, none of these approaches can provide satisfactory properties.

SUMMARY OF THE INVENTION

It is therefore an object of the present invention to provide a positive type photoresist composition having a high resolution.

It is another object of the present invention to provide a positive type photoresist composition having a high sensitivity.

It is a further object of the present invention to provide a positive type photoresist composition which enables accurate reproduction of mask dimension over a wide range of photomask line width.

It is a still further object of the present invention to provide a positive type photoresist composition which enables the production of a resist pattern having a section with a high aspect ratio in a pattern with a line width of 1 µm or less.

It is a yet still further object of the present invention to provide a positive type photoresist composition which can provide a resist image having an excellent heat resistance.

The above and other objects of the present invention will become more apparent from the following detailed description and examples.

The inventors made extensive studies paying attention to these properties. As a result, the inventors found that these objects of the present invention can be accomplished with a positive type photoresist composition, comprising an alkali-soluble novolak resin obtained by the condensation of substituted or unsubstituted phenols and aldehydes in the presence of a silica-magnesia solid catalyst and a light-sensitive material containing 1,2-naphthoquinonediazido-5- (and/or -4-) sulfonate as main component.

DETAILED DESCRIPTION OF THE INVENTION

The present invention will be further described hereinafter.

The alkali-soluble resin can be obtained by the condensation of substituted or unsubstituted phenols with aldehydes in the presence of a silica-magnesia solid catalyst.

In the present invention, substituted or unsubstituted phenols represented by formula (I) can be used.

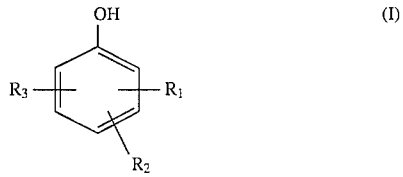

wherein $R_1$, $R_2$ and $R_3$, which may be the same or different, each represents a hydrogen atom, a $C_{1-4}$ alkyl group, an alkoxy group or a halogen atom.

Examples of such phenolic compounds include phenol, m-cresol, o-cresol, p-cresol, 2,6-bishydroxymethyl-p-cresol, 2-ethylphenol, 3-ethylphenol, 4-ethylphenol, 2-propylphenol, 3-propylphenol, 4-propylphenol, 2- butylphenol, 3-butylphenol, 4-butylphenol, 2-methoxyphenol, 3-methoxyphenol, 4-methoxyphenol, 2-ethoxyphenol, 3-ethoxyphenol, 4-ethoxyphenol, 2,3-xylenol, 2,5-xylenol, 3,4-xylenol, 3,5-xylenol, 2,3,5-trimethylphenol, 3,4,5-trimethylphenol, 2-chlorophenol, 3-chlorophenol, and 4-chlorophenol. These phenolic compounds can be used singly or in combination, Further preferred among these phenolic compounds are m-cresol, o-cresol, p-cresol, 2,6-bishydroxymethyl-p-cresol, 4-methoxyphenol, 3,4-xylenol, 3,5-xylenol, and 3,4,5-trimethylphenol.

Examples of aldehydes to be used in the present invention include aqueous solution of formaldehyde (formalin), paraformaldehyde, acetaldehyde, furfural, chloroacetaldehyde, acrolein, and acetal compounds thereof (e.g., chloroacetaldehyde diethylacetal). These aldehydes can be used in admixture.

Preferred among these aldehydes are aqueous solution of formaldehyde (formalin), paraformaldehyde, and chloroacetaldehyde diethylacetal.

The silica-magnesia catalyst to be used in the present invention is a solid catalyst containing as main components 20 to 90% by weight of $SiO_2$ and 80 to 10% by weight of MgO. Examples of such a solid catalyst include antigolite, chrysotile, talc, and vermiculite. Examples of solid catalysts which can be particularly preferably used in the present invention include MIZUKALIFE P-1 available from Mizusawa Kagaku Kogyo K.K. and KYOWAAD 600 available from Kyowa Kagaku Kogyo K.K.

The condensation of such substituted or unsubstituted phenols with such aldehydes in the presence of a silica-magnesia solid catalyst can be effected by an ordinary method. In particular, these materials are reacted with each other at a reaction temperature of 70° to 160° C. for 3 to 50 hours, and unreacted monomers are then distilled off to obtain the desired alkali-soluble novolak resin.

In the present invention, the silica-magnesia solid catalyst can be used in combination with an inorganic or organic acid catalyst which is used in the ordinary method, such as hydrochloric acid, sulfuric acid, formic acid, acetic acid, p-toluenesulfonic acid and oxalic acid. For example, there may be selectively used as necessary a process which comprises partial addition condensation of phenols with aldehydes in the presence of a silica-magnesia solid catalyst, and then further condensation of these materials with the addition of an inorganic or organic acid or a process which comprises partial addition condensation of phenols with aldehydes in the presence of an inorganic or organic acid, and then further condensation of these materials with the addition of a silica-magnesia solid catalyst.

The weight average molecular weight of the alkalisoluble novolak resin thus obtained is preferably in the range of 2,000 to 30,000. If this value falls below 2,000, the unexposed portions show a great reduction in the film after development. If this value exceeds 30,000, the development speed shows a drop. A particularly preferred range is from 3,000 to 20,000.

The weight average molecular weight is defined by gel permeation chromatography as calculated in terms of polystyrene.

As the alkali-soluble novolak resin to be used in the present invention there can be used one which has been subjected to solvent fractionation process or distillation at an elevated temperature under high vacuum to reduce low molecular contents such as dimer. This can provide further improvements in developability and heat resistance.

The solvent fractionation process can be accomplished, e.g., by a process which comprises dissolving a novolak resin which has been synthesized by an ordinary method in a polar solvent such as methanol, ethanol, acetone, methyl ethyl ketone, dioxane and tetrahydrofuran, and then putting the solution in water or a mixture of water and a polar solvent so that the resin content is precipitated.

In the synthesis of an alkali-soluble resin, water, unreacted monomers, formaldehyde and oxalic acid are distilled off under reduced pressure normally at a temperature of 150° to 200° C. after a predetermined period of time of reaction. On the other hand, in the distillation at an elevated temperature of 230° C. or higher, preferably 250° C. or higher, under high vacuum of 10 mmHg or lower, not only these components but also low molecular compounds such as dimer can be distilled off efficiently.

Examples of 1,2-naphthoquinonediazide compounds to be used in the present invention include 1,2-naphthoquinone-diazido-5-(and/or-4-) sulfonic acid ester of polyhydroxyaromatic compounds.

Examples of such a polyhydroxyaromatic compound include polyhydroxybenzophenones such as 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,4,6,3',4',5'-hexahydroxybenzophenone and 2,3,4,3',4',5'-hexahydroxybenzophenone; polyhydroxyphenylalkylketones such as 2,3,4-trihydroxyacetophenone and 2,3,4-trihydroxyphenylhexylketone; bis((poly)hydroxyphenyl)alkanes such as bis(2,4-dihydroxyphenyl)methane, bis(2,3,4-trihydroxyphenyl)methane and bis(2,4-dihydroxyphenyl)propane; polyhydroxybenzoic esters such as propyl 3,4,5-trihydroxybenzoate and phenyl 3,4,5-trihydroxybenzoate; bis(polyhydroxybenzoyl)alkanes or bis(polyhydroxybenzoyl)aryls such as bis(2,3,4-trihydroxybenzoyl)methane and bis(2,3,4-trihydroxybenzoyl)benzene; alkylene-di(polyhydroxybenzoate) such as ethyleneglycol-di(3,5-dihydroxybenzoate); polyhydroxybiphenyls such as 3,5,3',5'-biphenyltetrol, 2,4,2',4'-biphenyltetrol, 2,4,6,3',5'-biphenylpentol and 2,4,6,2',4',6'-biphenylhexol; polyhydroxytriphenylmethanes such as 4,4',3",4"-tetrahydroxy-3,5,3',5'-tetramethyltriphenylmethane, 4,4',2',3",4"-pentahydroxy-3,5,3',5'-tetramethyltriphenylmethane and 2,3,4,2',3',4',3",4"-octahydroxy-5,5'-diacetyltriphenylmethane; polyhydroxyspirobiindans such as 3,3,3',3'-tetramethyl-1,1'-spirobiindan-5,6,5',6'-tetrol, 3,3,3',3'-tetramethyl-1,1'-spirobiindan-5,6,7,5',6',7'-hexol,3,3,3',3'-tetramethyl-1,1'-spirobiindan-4,5,6,4',5',6'-hexol and 3,3,3',3'-tetramethyl-1,1'-spirobiindan-4,5,6,5',6',7'-hexol; condensates of polyhydroxy compound with 2,6-bishydroxy-methyl-p-cresol, such as 2,6-bis(2,4-dihydroxybenzyl)-p-cresol, 2,6-bis(2,3,4-trihydroxybenzyl)-p-cresol and 2,6-bis(5-acetyl-2,3,4-trihydroxybenzyl)-p-cresol; phenylindans such as 1-(2,4-dihydroxyphenyl)-1,3,3-trimethyl-6-hydroxyindan and 1-(2,4-dihydroxyphenyl)-1,3,3-trimethyl-4,6-dihydroxyindan; and flavono dyes such as quercetin and rutin.

Preferred among these light-sensitive materials are those made of polyhydroxybenzophenones, polyhydroxytriphenylmethanes, polyhydroxyspirobiindans, condensates of 2,6-bishydroxymethyl-p-cresol with polyhydroxy compound, and 1,2-naphthoquinonediazidosulfonic ester of polyhydroxyphenylindans.

The proportion of the light-sensitive material to the alkali-soluble novolak resin is in the range of 5 to 100 parts by weight, preferably 10 to 50 parts by weight based on 100 parts by weight of novolak resin. If this value falls below 5 parts by weight, the percent film remainining is remarkably lowered. If this value exceeds 100 parts by weight, the sensitivity and the solubility in a solvent are lowered.

In the present invention, there may be used a low molecular compound containing aromatic hydroxyl groups for the purpose of improving sensitivity without impairing resolution, developability, pattern profile and heat resistance.

As such a low molecular compound containing aromatic hydroxyl groups there may be used a $C_{12-50}$ compound containing 2 to 8 aromatic hydroxyl groups. Particularly preferred among these compounds are compounds which add to the rate at which the novolak resin of the present invention is dissolved in an alkali when incorporated in the novolak resin. If this compound contains 51 or more carbon atoms, the effects of the present invention are remarkably eliminated. On the other hand, if this compound contains less than 11 carbon atoms, new disadvantages such as deterioration in heat resistance occur. In order to attain the effects of the present invention, it is necessary that this compound contain at least two hydroxyl groups. If this compound contains 9 or more hydroxyl groups, the resulting resolution is low.

The amount of the low molecular compound to be added is preferably in the range of 2 to 30% by weight, more preferably 5 to 25% by weight based on the novolak resin. If this value exceeds 30% by weight, a new disadvantage, i.e., deformation of the pattern upon development occurs.

As such a low molecular compound, there can be used any compound which can meet the above mentioned structural requirements. In particular, there may be preferably used a compound having a structure differing from that of the low molecular component in the novolak resin represented by formula (1). Examples of such a compound include those represented by formulae (2) to (9).

In the present invention, compounds having other structures may be used. However, compounds having a structure represented by formula (1) exhibit effects which are smaller than described above.

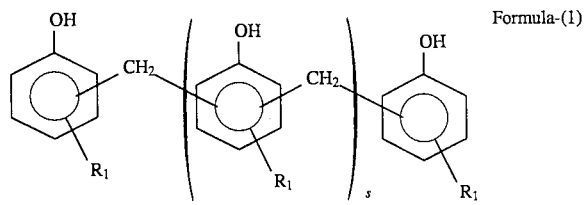

Formula-(1)

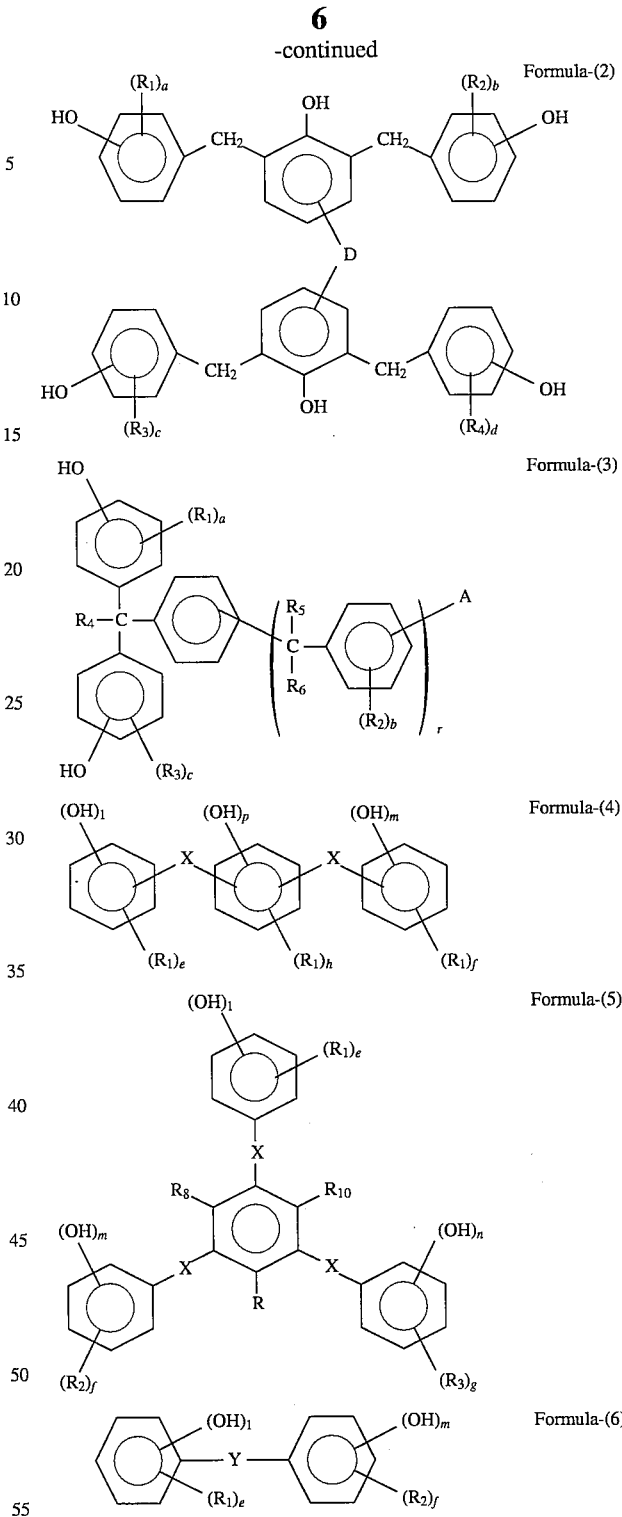

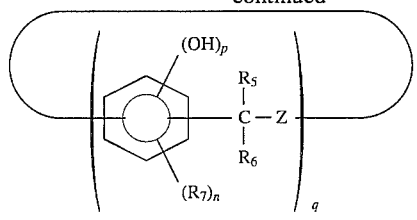

Formula-(7)

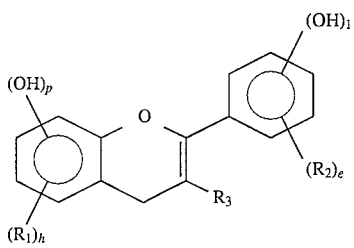

Formula-(8)

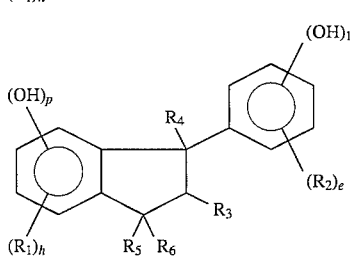

Formula-(9)

wherein $R_1$, $R_2$, $R_3$ and $R_4$, which may be the same or different, each represents a halogen atom, a lower alkyl group, an alkoxy group, an acyl group or an acyloxy group; $R_5$ and $R_6$, which may be the same or different, each represents a hydrogen atom, a lower alkyl group or a lower haloalkyl group; $R_7$ represents a hydrogen atom, a halogen atom, a lower alkyl group, an alkoxy group, an acyl group or an acyloxy group; $R_8$, $R_9$ and $R_{10}$, which may be the same or different, each represents a hydrogen atom, a halogen atom, a hydroxyl group, a lower alkyl group, an alkoxy group, an acyl group or an acyloxy group; a, b, c and d each represents an integer 0 to 3; l, m and n each represents an integer 1 to 3; e, f and g each represents an integer 0 to 2; p represents an integer 1 to 3; h represents an integer 0 to (4-p); q represents an integer 3 to 8; r represents an integer 1 to 3; s represents an integer 0 to 4 (Formula (1) is a mixture of a plurality of compounds wherein s has these values); A represents a hydrogen atom or a hydroxyl group; X represents a methylene group, a lower alkyl-substituted methylene group, a halomethylene group or a haloalkylmethylene group; Y represents a methylene group, a lower alkyl-substituted methylene group, a benzylidene group, a substituted benzylidene group, a substituted or unsubstituted $C_{2-8}$ straight-chain or branched alkylene group or a oxyalkylene group; Z represents a single bond or an oxymethylene group; and D represents $>C=O$, $—S—$, $>SO_2$, $>C—R_5$, single bond, or

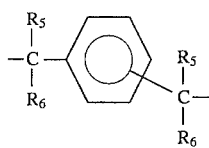

Examples of solvents for dissolving the present light-sensitive material and alkali-soluble novolak resin include ketones such as methyl ethyl ketone, and cyclohexanone; alcohol ethers such as ethylene glycol monomethyl ether, and ethylene glycol monoethyl ether; ethers such as dioxane and ethylene glycol dimethyl ether; cellosolve esters such as methylcellosolve acetate, and ethylcellosolve acetate; aliphatic esters such as butyl acetate, methyl lactate, and ethyl lactate; halogenated hydrocarbons such as 1,1,2-trichloroethylene; and highly polar solvents such as dimethyl acetamide, N-methylpyrrolidone, dimethylformamide, and dimethylsulfoxide. These solvents can be used singly or in admixture.

The positive type photoresist composition of the present invention can comprise a dye, a plasticizer, an adhesion aid, a surface active agent, etc. as necessary. Specific examples of such additives include dyes such as methyl violet, crystal violet and malachite green; plasticizers such as stearic acid, acetal resin, phenoxy resin, alkyd resin, and epoxy resin; adhesion aids such as hexamethyl disilazane, and chloromethyl silane; and surface active agents such as nonylphenoxypoly(ethyleneoxy)ethanol, and octylphenoxypoly(ethyleneoxy)ethanol.

The above mentioned positive type photoresist composition can be coated by a proper coating means such as spinner and coater on a substrate as commonly used in the production of precision integrated circuit elements (e.g., silicon coated with silicon dioxide), exposed to light through a predetermined mask, and then developed to obtain an excellent resist.

Examples of the developer which can be used to develop the positive type photoresist composition of the present invention include alkaline aqueous solutions such as inorganic alkalies (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcoholamines (e.g., dimethylethanolamine, triethanolamine), quaternary ammonium salts (e.g., tetramethylammonium-hydroxide, tetraethylammonium hydroxide), and cyclic amines (e.g., pyrrole, piperidine). The above mentioned alkaline aqueous solutions can comprise alcohols, surface active agents, aromatic hydroxyl group-containing compounds, etc. in proper amounts.

The positive type photoresist composition of the present invention exhibits a high sensitivity and an excellent resolution, heat resistance and resist profile and thus can be preferably used as photorest for fine work.

The present invention will be further described hereinafter, but the present invention should not be construed as being limited thereto. In Table 1, figures indicate parts by weight, and F/C ratio indicates the molar ratio of aldehydes to phenols.

The weight average molecular weight and monomer and dimer contents were determined as follows:

Gel permeation chromatography (GPC) was used. Measurement was effected at a temperature of 40° C., a flow rate of 1 ml/min. and a detection wavelength of 282 nm with THF as solvent. As columns there were used TSK gel $GMH_{XL}$, $G4000H_{XL}$, $G3000H_{XL}$ and $G2000H_{XL}$ available from Toyo Soda Manufacturing Co., Ltd. These columns were connected. In this arrangement, the weight average molecular weight was determined with monodisperse polystyrene as reference. The monomer and dimer contents were determined under similar conditions.

SYNTHESIS EXAMPLES 1–9

Synthesis of novolak resins a–i

Cresol, xylenol, alkoxyphenol, phenol, paraformaldehyde and MIZUKALIFE P-1 (available from Mizusawa Kagaku Kogyo K.K.) as set forth in Table 1 were charged into a three-necked flask equipped with a reflux condenser, a thermometer and an agitator. The material was then heated to a temperature of 125° C. with stirring where it was allowed to react for 4 hours.

Oxalic acid was added to the material. The material was further allowed to react for 12 hours. After the reaction, the material was heated to a temperature of 200° C. where it was distilled off under normal pressure for 90 minutes. The system was then gradually evacuated to 2 to 3 mmHg where it was distilled off for 90 minutes.

The molten alkali-soluble novolak resins thus obtained were cooled to room temperature and recovered.

SYNTHESIS EXAMPLES 10–12

Synthesis of novolak resins j–l

Cresol, 37.0% aqueous solution of formaldehyde and MIZUKALIFE P-1 (available from Mizusawa Kagaku Kogyo K.K.) set forth in Table 1 were charged into a three-necked flask equipped with a reflux condenser, a thermometer and an agitator. The material was then heated to a temperature of 110° C. with stirring where it was allowed to react for 15 hours.

After the reaction, the material was heated to a temperature of 200° C. where it was distilled off under normal pressure for 90 minutes. The system was then gradually evacuated to 2 to 3 mmHg where it was distilled off for 90 minutes.

The molten alkali-soluble novolak resins thus obtained were cooled to room temperature and recovered.

SYNTHESIS EXAMPLE 13

Synthesis of novolak resin x

Cresol, 37.0% aqueous solution of formaldehyde and oxalic acid set forth in Table 1 were charged into a three-necked flask equipped with a reflux condenser, a thermometer and an agitator. The material was then heated to a temperature of 110° C. with stirring where it was allowed to react for 15 hours.

After the reaction, the material was heated to a temperature of 200° C. where it was distilled off under normal pressure for 90 minutes. The system was then gradually evacuated to 2 to 3 mmHg where it was distilled off for 90 minutes.

The molten alkali-soluble novolak resins thus obtained were cooled to room temperature and recovered.

SYNTHESIS EXAMPLE 14

Synthesis of light-sensitive material (A)

10 g of 2,3,4,4'-tetrahydroxybenzophenone, 35.0 g of 1,2-naphthoquinonediazido-5-sulfonyl chloride and 350 ml of acetone were charged into a three-necked flask to effect uniform dissolution.

A mixture of 13.4 g of triethylamine and 35 ml of acetone was gradually added dropwise to the solution. The system was then allowed to react at a temperature of 25° C. for 3 hours. The reaction mixture was poured into 1,700 ml of a 1% aqueous solution of hydrochloric acid. The resulting precipitate was filtered off, washed with water, and then dried at a temperature of 40° C. to obtain a light-sensitive material (A).

SYNTHESIS EXAMPLE 15

Synthesis of light-sensitive material (B)

10 g of 3,3,3',3'-tetramethyl-1,1'-spirobiindan-5,6,7,5',6', 7'-hexol, 33.9 g of 1,2-naphthoquinonediazido-5-sulfonyl chloride and 340 ml of acetone were charged into a three-necked flask to effect uniform dissolution.

A mixture of 13.2 g of triethylamine and 35 ml of acetone was gradually added dropwise to the solution. The system was then allowed to react at a temperature of 25° C. for 3 hours. The reaction mixture was poured into 1,700 ml of a 1% aqueous solution of hydrochloric acid. The resulting precipitate was filtered off, washed with water, and then dried at a temperature of 40° C. to obtain a light-sensitive material (B).

SYNTHESIS EXAMPLE 16

Synthesis of light-sensitive material (C)

10 g of 2,6-bis(2,3,4-trihydroxybenzyl)-p-cresol, 35.0 g of 1,2-naphthoquinonediazido-5-sulfonyl chloride and 350 ml of acetone were charged into a three-necked flask to effect uniform dissolution.

A mixture of 16.7 g of 4-dimethylaminopyridine and 200 ml of acetone was gradually added dropwise to the solution. The system was then allowed to react at a temperature of 25° C. for 3 hours. The reaction mixture was poured into 2,400 ml of a 1% aqueous solution of hydrochloric acid. The resulting precipitate was filtered off, washed with water, and then dried at a temperature of 40° C. to obtain a light-sensitive material (C).

SYNTHESIS EXAMPLE 17

Synthesis of light-sensitive material (D)

10 g of 1-(2,4-dihydroxyphenyl)-1,3,3-trimethyl-4,6-dihydroxyindan, 26.9 g of 1,2-naphthoquinonediazido-5-sulfonyl chloride and 270 ml of acetone were charged into a three-necked flask to effect uniform dissolution.

t mixture of 10.4 g of triethylamine and 28 ml of acetone was gradually added dropwise to the solution. The system was then allowed to react at a temperature of 25° C. for 3 hours. The reaction mixture was poured into 1,300 ml of a 1% aqueous solution of hydrochloric acid. The resulting precipitate was filtered off, washed with water, and then dried at a temperature of 40° C. to obtain a light-sensitive material (D).

Examples 1–16

(1) Preparation of novolak resins m to p and y 55 g of each of the novolak resins b, c, g, h and x thus synthesized was dissolved in a mixture of 150 g of methanol and 30 g of ethylcellosolve acetate. 100 g of pure water was then gradually added to the material to precipitate a resinous content. The upper phase was removed by decantation. The precipitated resinous content was recovered, heated to a temperature of 40° C., and then dried under reduced pressure for 24 hours.

| Synthesized novolak | | Fractionated novolak | Mw |
|---|---|---|---|
| b | => | m | 4,600 |
| c | => | n | 5,300 |
| h | => | o | 7,700 |
| i | => | p | 5,900 |
| x | => | y | 5,800 |

(2) Preparation and evaluation of positive type photoresist composition 5 g of each of the novolak resins a to k and x, 1.10 g of each of the light-sensitive materials (A) to (D) and a low molecular compound containing an aromatic hydroxyl group having a composition set forth in Table 2 were dissolved in 18 g of ethyl cellosolve acetate. The solution was then filtered through a microfilter having 0.2-μm diameter pores to prepare a photoresist composition. The photoresist composition was then coated on a silicon wafer by means of a spinner. The coat material was dried at a temperature of 110° C. in an atmosphere of nitrogen in a convection oven for 30 minutes to obtain a resist film having a thickness of 1.2 μm. This film was exposed to light by means of a reduction projection exposure apparatus (NSR 1505 available from Nikon), developed with a 2.38% aqueous solution of tetramethylammonium hydroxide for 1 minute, washed with water for 30 seconds, and then dried. The resist pattern thus developed on the silicon wafer was then observed by a scanning electron microscope for evaulation of resist. The results are set forth in Table 3.

The sensitivity was defined as reciprocal of the exposure which enables the reproduction of a 1.0 μm mask pattern. The sensitivity value was given relative to that of Comparative Example 1.

The percent film remaining was defined as percentage of ratio of amount of film before development to that after development on the unexposed portion.

The resolving power indicates the resolution limit at the exposure which enables the reproduction of 1.0 μm mask pattern.

The heat resistance indicates the temperature at which a resist pattern formed on the silicon wafer doesn't deform when baked in a convection oven for 30 minutes.

The resist shape is represented by the angle (θ) between the resist wall and the silicon wafer plane in the section of a 1.0 μm resist pattern.

TABLE 1

Synthesis of alkali-soluble novolak resin (unit: part by weight)

| Component, Others | Examples | | | | | | | | | | | | Comparative Example |
|---|---|---|---|---|---|---|---|---|---|---|---|---|---|
|  | a | b | c | d | e | f | g | h | i | j | k | l | x |
| m-Cresol | 50 | 65 | 75 | 85 | 85 | 75 | 75 | 65 | 75 | 65 | 75 | 85 | 40 |
| p-Cresol | 50 | 35 | 25 | 15 | 15 | — | — | — | — | 35 | 25 | 15 | 60 |
| 3,4-Xylenol | — | — | — | — | — | 28.3 | — | — | — | — | — | — | — |
| 3,5-Xylenol | — | — | — | — | — | — | 28.3 | — | — | — | — | — | — |
| 4-Methoxyphenol | — | — | — | — | — | — | — | 40.2 | — | — | — | — | — |
| 2,6-Bishydroxymethyl-p-cresol | — | — | — | — | — | — | — | — | 38.9 | — | — | — | — |
| Mizukalife P-1 | 0.07 | 0.15 | 0.50 | 0.70 | 1.00 | 0.15 | 0.15 | 0.15 | 0.15 | 0.15 | 0.30 | 0.45 | — |
| Oxalic acid | 0.70 | 1.50 | 5.00 | 7.00 | 10.00 | 1.50 | 1.50 | 1.50 | 1.50 | — | — | — | 0.10 |
| F/C ratio | 0.65 | 0.70 | 0.75 | 0.77 | 0.81 | 0.70 | 0.70 | 0.72 | 0.63 | 0.65 | 0.80 | 0.80 | 0.60 |
| Mw | 5200 | 3900 | 4500 | 6000 | 12000 | 4600 | 4800 | 6800 | 4600 | 3600 | 4300 | 4500 | 4700 |

TABLE 2

Formulation of photoresist composition

| | Alkali-soluble novolak resin | Type and added amount of low molecular compound containing aromatic hydroxyl group | | Light-sensitive Material |
|---|---|---|---|---|
| | | Type | Added Amount (g) | |
| Example 1 | a | — | — | A |
| Example 2 | b | — | — | B |
| Example 3 | c | — | — | D |
| Example 4 | d | — | — | C |
| Example 5 | e | Compound of formula (3) wherein a to c = 0, $R_4$ to $R_6$ = methyl group, A = hydroxyl group, r = 1 | 1.25 | A |
| Example 6 | f | — | — | A |
| Example 7 | g | — | — | D |
| Example 8 | h | Compound of formula (3) wherein a to c = 0, $R_4$ to $R_6$ = methyl group, A = hydroxyl group, r = 1 | 0.75 | B |
| Example 9 | i | — | — | C |
| Example 10 | j | — | — | A |
| Example 11 | k | — | — | B |
| Example 12 | l | — | — | C |
| Example 13 | m | Nordihydroguaiaretic acid in formula (6) | 0.50 | B |
| Example 14 | n | 2,6-Bis(2-hydroxy-5-methylbenzyl)-p-cresol formula (4) | 0.90 | B |
| Example 15 | o | 2,4,6-Tris(3,5-dimethyl-4-hydroxy- | 1.20 | A |

TABLE 2-continued

Formulation of photoresist composition

| | Alkali-soluble novolak resin | Type and added amount of low molecular compound containing aromatic hydroxyl group | | Light-sensitive Material |
|---|---|---|---|---|
| | | Type | Added Amount (g) | |
| | | benzyl)-1,3,5-trihydroxybenzene in formula (5) | | |
| Example 16 | p | Compound of formula (3) wherein a to c = 0, $R_4$ to $R_6$ = methyl group, A = hydroxyl group, r = 1 | 0.75 | C |
| Comparative Example 1 | x | — | — | A |
| Comparative Example 2 | y | Compound of formula (3) wherein a to c = 0, $R_4$ to $R_6$ = methyl group, A = hydroxyl group, r = 1 | 0.75 | A |

TABLE 3

Properties of resist

| | Relative sensitivity | Percent film remaining (%) | Resolving power (μm) | Heat resistance (°C.) | Resist shape (θ) |
|---|---|---|---|---|---|
| Example 1 | 1.1 | 100 | 0.70 | 140 | 89 |
| Example 2 | 1.5 | 99 | 0.65 | 135 | 88 |
| Example 3 | 1.6 | 99 | 0.65 | 140 | 88 |
| Example 4 | 1.3 | 99 | 0.65 | 145 | 89 |
| Example 5 | 1.4 | 100 | 0.70 | 145 | 89 |
| Example 6 | 1.3 | 99 | 0.70 | 145 | 89 |
| Example 7 | 1.3 | 99 | 0.65 | 145 | 89 |
| Example 8 | 1.5 | 98 | 0.65 | 140 | 88 |
| Example 9 | 1.5 | 100 | 0.65 | 135 | 89 |
| Example 10 | 1.4 | 99 | 0.70 | 135 | 87 |
| Example 11 | 1.4 | 99 | 0.65 | 135 | 88 |
| Example 12 | 1.4 | 99 | 0.65 | 135 | 88 |
| Example 13 | 1.3 | 100 | 0.65 | 140 | 89 |
| Example 14 | 1.4 | 100 | 0.65 | 145 | 89 |
| Example 15 | 1.3 | 100 | 0.70 | 145 | 89 |
| Example 16 | 1.5 | 100 | 0.65 | 145 | 89 |
| Comparative Example 1 | 1.0 | 98 | 0.80 | 130 | 86 |
| Comparative Example 2 | 0.9 | 99 | 0.85 | 135 | 85 |

While the invention has been described in detail and with reference to specific embodiments thereof, it will be apparent to one skilled in the art that various changes and modifications can be made therein without departing from the spirit and scope thereof.

What is claimed is:

1. A positive photoresist composition, comprising an admixture of an alkali-soluble novolak resin obtained by the condensation of substituted or unsubstituted phenols and aldehydes in the presence of a silica-magnesia solid catalyst, said phenols being comprised of 50 or more percent by weight of phenols represented by the following formula:

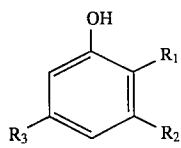

wherein $R_1$, $R_2$ and $R_3$, which may be the same or different, each represents a hydrogen atom, a $C_{1-4}$ alkyl group, a $C_{1-4}$ alkoxy group or a halogen atom, and a light-sensitive material containing 1,2-naphthoquinone-diazido-5-(and/or -4-) sulfonate as main components.

2. A positive photoresist composition as claimed in claim 1, wherein said silica-magnesia solid catalyst contains as main components 20 to 90% by weight of $SiO_2$ and 80 to 10% by weight of MgO.

3. A positive photoresist composition as claimed in claim 1, wherein said 1,2-naphthoquinonediazide-5-(and/or -4-) sulfonate is obtained by the reaction of a 1,2-naphthoquinonediazido-5-(and/or -4-) sulfonyl salt with a polyhydroxy aromatic compound selected from the group consisting of a polyhydroxybenzophenone, a polyhydroxyphenylhexyl-ketone, a bis((poly)hydroxyphenyl)alkane, a polyhydroxybenzoic ester, a bis(polyhydroxybenzoyl)alkane, a bis(polyhydroxybiphenyl), an alkylene-di(polyhydroxybenzoate), a polyhydroxybiphenyl, a polyhydroxytriphenylmethane, a polyhydroxyspiroindan, a condensate of 2,6-bishydroxymethyl-p-cresol with a polyhydroxy compound, a phenylindan, and a flavono dye.

4. A positive photoresist composition as claimed in claim 3, wherein said polyhydroxy aromatic compound is selected from the group consisting of a polyhydroxybenzophenone, a polyhydroxytriphenylmethane, a polyhydroxyspirobiindan, a condensate of 2,6-bishydroxy-methyl-p-cresol with a polyhydroxy compound, and a 1,2-naphthoquinonediazidosulfonic ester of a polyhydroxyphenylindan.

5. A positive photoresist composition as claimed in claim 3, wherein the proportion of the light-sensitive material to the alkali-soluble novolak resin is 5 to 100 parts by weight, based on 100 parts by weight of novolak resin.

6. A positive photoresist composition as claimed in claim 1, wherein said composition further contains from 2 to 30% by weight, based on the novolak resin, of a low molecular compound containing aromatic hydroxyl groups.

7. A positive photoresist composition as claimed in claim 6, wherein said low molecular compound is a $C_{12-50}$ compound containing 2 to 8 aromatic hydroxyl groups.

* * * * *